US011424490B2

(12) United States Patent
Takahashi et al.

(10) Patent No.: US 11,424,490 B2
(45) Date of Patent: Aug. 23, 2022

(54) BATTERY CONTROL DEVICE, CONTROL METHOD, COMPUTER-READABLE STORAGE MEDIUM STORING PROGRAM, AND VEHICLE

(71) Applicant: TOYOTA JIDOSHA KABUSHIKI KAISHA, Toyota (JP)

(72) Inventors: Kohei Takahashi, Toyota (JP); Haruyuki Onoda, Kitashitara-gun (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 71 days.

(21) Appl. No.: 17/089,346

(22) Filed: Nov. 4, 2020

(65) Prior Publication Data

US 2021/0257676 A1  Aug. 19, 2021

(30) Foreign Application Priority Data

Feb. 17, 2020  (JP) .............................. JP2020-024513

(51) Int. Cl.
*H01M 10/42* (2006.01)
*G01R 19/165* (2006.01)
*H02J 7/00* (2006.01)

(52) U.S. Cl.
CPC ...... *H01M 10/425* (2013.01); *G01R 19/1659* (2013.01); *G01R 19/16542* (2013.01); *H02J 7/007182* (2020.01); *H01M 2010/4271* (2013.01); *H01M 2010/4278* (2013.01); *H01M 2220/20* (2013.01)

(58) Field of Classification Search
USPC ......................................... 324/426, 432–434
See application file for complete search history.

(56) References Cited

U.S. PATENT DOCUMENTS

2008/0150483 A1* 6/2008 Morita .................... H02J 9/061
                                                            320/122
2018/0024196 A1* 1/2018 Imura ................... H02J 7/0031
                                                          324/762.01

FOREIGN PATENT DOCUMENTS

WO        2016/103721 A1    6/2016

* cited by examiner

*Primary Examiner* — Vincent Q Nguyen
(74) *Attorney, Agent, or Firm* — Oliff PLC

(57) ABSTRACT

A battery control device that controls a connection between a battery and a load includes a first switch inserted between the battery and the load, a bypass circuit between the battery and the load, which is connected in parallel to the first switch and includes a second switch on the battery side, a diode unit composed of two diodes, and a third switch that are connected in series, an instruction unit that instructs the first, second, and third switches to open or close, an acquisition unit that acquires voltages of both ends of the second and third switches, respectively, and a diagnosis unit that diagnoses whether the first switch operates normally based on open or closed states of the switches and the voltages.

11 Claims, 4 Drawing Sheets

FIG. 4

| CASE | $|V_{AM} - V_{LIB}|$ | $|V_{D2} - V_{D1}|$ | $V_{LIB}$ IMMEDIATELY BEFORE OPENING OF SW1 | $I_{LIB}$ | EXTERNAL CHARGER | BATTERY CHARGING/DISCHARGING | STATE OF SW1 | DIAGNOSIS RESULT ON SW1 |
|---|---|---|---|---|---|---|---|---|
| [1] | EXCEEDS Th1 | — | — | — | — | — | DIFFERENCE OF VOLTAGES BETWEEN BOTH ENDS OCCURS | FIXED ON OPEN STATE |
| [2] | EQUAL TO OR LOWER THAN Th1 | EQUAL TO OR HIGHER THAN Th2 | — | — | DISCONNECTED | CHARGING/DISCHARGING | — | NORMAL |
| [3] | EQUAL TO OR LOWER THAN Th1 | LOWER THAN Th2 | EQUAL TO OR HIGHER THAN Th3 | — | — | DISCHARGING | — | FIXED ON CLOSED STATE |
| [4] | EQUAL TO OR LOWER THAN Th1 | LOWER THAN Th2 | LOWER THAN Th3 | EQUAL TO OR LOWER THAN Th4 | CONNECTED | NONE | — | NORMAL |
| [5] | EQUAL TO OR LOWER THAN Th1 | LOWER THAN Th2 | LOWER THAN Th3 | EXCEEDS Th4 | DISCONNECTED | DISCHARGING | — | FIXED ON CLOSED STATE |

BATTERY CONTROL DEVICE, CONTROL METHOD, COMPUTER-READABLE STORAGE MEDIUM STORING PROGRAM, AND VEHICLE

CROSS-REFERENCE TO RELATED APPLICATION

This application claims priority to Japanese Patent Application No. 2020-024513 filed on Feb. 17, 2020, incorporated herein by reference in its entirety.

BACKGROUND

1. Technical Field

The present disclosure relates to a battery control device, a control method, and a computer-readable storage medium storing a program that control a connection between a battery and a load, and a vehicle including the battery control device.

2. Description of Related Art

WO 2016/103721 proposes a device that diagnoses a switch (such as a relay) that switches between connected and disconnected states between a battery and a load, using a bypass circuit connected in parallel to the switch. In WO 2016/103721, at the time of diagnosing a switch, the device detects a voltage drop occurring in the bypass circuit by disconnecting the switch and connecting the battery to the load via the bypass circuit, thereby detecting whether a state of the switch is normal or abnormal.

SUMMARY

The bypass circuit described in WO 2016/103721 cannot cause a current to flow in only the discharging direction from the battery to the load. For this reason, when the switch is diagnosed while the battery is connected to an external charger, the state of the switch may be inaccurately diagnosed because the voltage drop does not occur in the bypass circuit.

The present disclosure provides a battery control device, a control method, a computer-readable storage medium, and a vehicle that can execute a diagnosis of a switch with high accuracy even while an external charger is connected.

A first aspect of the present disclosure is a battery control device that controls a connection between a battery and a load. The battery control device includes a first switch inserted between the battery and the load, a bypass circuit between the battery and the load, which is connected in parallel to the first switch and includes a second switch on the battery side, a diode unit composed of two diodes connected in parallel with rectification directions of the diodes being opposite to each other, and a third switch that are connected in series, an instruction unit configured to instruct the first switch, the second switch, and the third switch to open or close, respectively, an acquisition unit configured to acquire voltages of both ends of the second switch and voltages of both ends of the third switch, respectively, and a diagnosis unit configured to diagnose whether the first switch operates normally based on open or closed states of the switches instructed by the instruction unit and the voltages acquired by the acquisition unit.

In the first aspect, the diagnosis unit may determine, in a first state where the instruction unit instructs the first switch to close and the second switch and the third switch to open, that an operation of the first switch is abnormal when an absolute value of a difference between a battery voltage that is a voltage at one end of the second switch to which the battery is connected and a load voltage that is a voltage at one end of the third switch to which the load is connected exceeds a first threshold.

In the first aspect, the diagnosis unit may determine, in a second state where the instruction unit instructs the first switch to open and the second switch and the third switch to close, that the operation of the first switch is normal when a diode voltage, which is an absolute value of a difference between a voltage at the other end of the second switch to which the diode unit is connected and a voltage at the other end of the third switch to which the diode unit is connected is equal to or higher than a second threshold.

In the first aspect, the diagnosis unit may determine, in the second state, that the operation of the first switch is abnormal when the diode voltage is lower than the second threshold and the battery voltage is equal to or higher than a third threshold immediately before opening the first switch.

In the first aspect, the acquisition unit may further acquire a battery current, which is a current flowing through the battery. The diagnosis unit may determine, in the second state, that the operation of the first switch is abnormal when the diode voltage is lower than the second threshold, the battery voltage is lower than the third threshold, and the battery current exceeds a fourth threshold.

In the first aspect, the acquisition unit may further acquire a battery current, which is a current flowing through the battery. The diagnosis unit may determine, in the second state, that the operation of the first switch is normal when the diode voltage is lower than the second threshold, the battery voltage is lower than the third threshold, and the battery current is equal to or lower than a fourth threshold.

In the first aspect, the diagnosis unit may determine, in a third state where the instruction unit instructs the second switch to open and the first switch and the third switch to close, that an operation of the third switch is abnormal when an absolute value of a difference between the load voltage and a voltage at the other end of the third switch to which the diode unit is connected exceeds a fifth threshold.

In the first aspect, the diagnosis unit may determine, in a fourth state where the instruction unit instructs the third switch to open and the first switch and the second switch to close, that an operation of the second switch is abnormal when an absolute value of a difference between the battery voltage and a voltage at the other end of the second switch to which the diode unit is connected exceeds a sixth threshold.

Further, a second aspect of the present disclosure is a control method executed by a computer of a battery control device. The battery control device controls a connection between a battery and a load using a first switch inserted between the battery and the load, and a bypass circuit between the battery and the load, which is connected in parallel to the first switch and includes a second switch on the battery side, a diode unit composed of two diodes connected in parallel with rectification directions of the diodes being opposite to each other, and a third switch that are connected in series. The control method includes a step of instructing the first switch, the second switch, and the third switch to open or close, respectively, a step of acquiring voltages of both ends of the second switch and voltages of both ends of the third switch, respectively, and a step of diagnosing whether the first switch operates normally based on the instructed open or closed states of the switches and the acquired voltages.

Further, a third aspect of the present disclosure is a computer-readable storage medium storing a program that causes a computer of a battery control device to execute a function. The battery control device controls a connection between a battery and a load using a first switch inserted between the battery and the load, and a bypass circuit between the battery and the load, which is connected in parallel to the first switch and includes a second switch on the battery side, a diode unit composed of two diodes connected in parallel with rectification directions of the diodes being opposite to each other, and a third switch that are connected in series. The function includes a step of instructing the first switch, the second switch, and the third switch to open or close, respectively, a step of acquiring voltages of both ends of the second switch and voltages of both ends of the third switch, respectively, and a step of diagnosing whether the first switch operates normally based on the instructed open or closed states of the switches and the acquired voltages.

Further, a fourth aspect of the present disclosure is a vehicle including the battery control device.

With each aspect of the present disclosure, since a bypass circuit including a diode unit composed of two diodes connected in parallel with rectification directions of the diodes being opposite to each other is used, even while an external charger is connected, it is possible to diagnose a switch, and thus improve the accuracy of the switch diagnosis.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 4 is a diagram illustrating a diagnosis result on a first switch based on the control of the main circuit diagnosis.

DETAILED DESCRIPTION OF EMBODIMENTS

A battery control device according to the present disclosure is provided, together with a switch connecting a battery and a load, with a bypass circuit that can bidirectionally cause a current to flow (discharge/charge) between the battery and the load. Whether switches operate normally is diagnosed based on open/closed states of the switches according to instructions, a voltage detected at each part of the bypass circuit, and a current flowing through the battery. As such, the accuracy of diagnoses of the switches is improved.

Hereinafter, embodiments of the present disclosure will be described in detail, exemplifying a case where a battery control device is mounted on a vehicle, with reference to drawings.

Embodiments

Configuration

Figure 1:
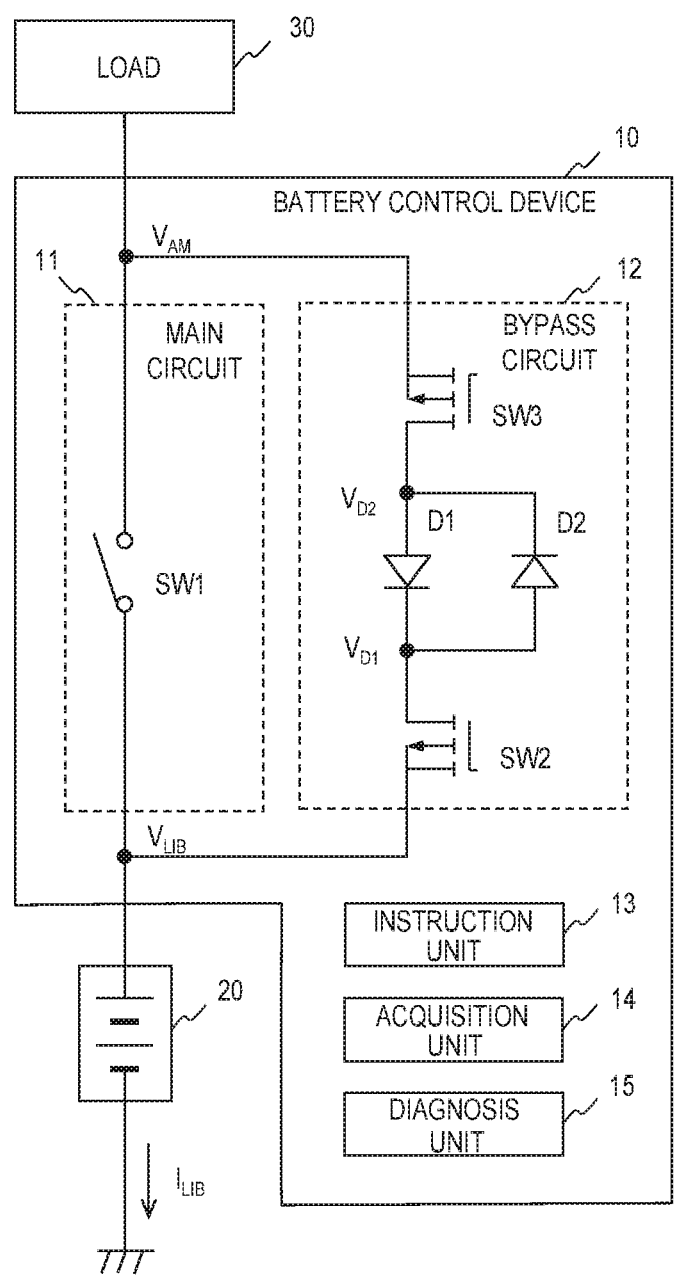
FIG. 1 is a functional block diagram of a battery control device and its peripheral portion according to an embodiment.

FIG. 1 is a functional block diagram of a battery control device 10 and its peripheral portion according to an embodiment of the present disclosure. The functional block illustrated in FIG. 1 includes the battery control device 10, a battery 20, and a load 30. The battery 20 is connected to the load 30 via the battery control device 10, such that a discharging process from the battery 20 to the load 30 and a charging process from the load 30 to the battery 20 via the battery control device 10 are possible. The battery control device 10 is mounted on, for example, a hybrid vehicle (HV) or an electric vehicle (EV).

The load 30 is a device, such as electronic equipment or an electrical component, referred to as an electronic control unit (ECU), mounted on a vehicle. Moreover, the load 30 includes an external charger or charging equipment (hereinafter, referred to as an "external charger or the like") connected to the vehicle so as to charge the battery 20 or the like. As the external charger or the like, equipment having a maximum voltage less than a specified maximum voltage of the battery 20 is used.

The battery 20 is a rechargeable secondary battery, such as a lead storage battery or a lithium-ion battery. Under control of the battery control device 10, the battery 20 can supply the power stored therein to a load 30 such as an ECU. Further, under the control of the battery control device 10, the battery 20 can store the power supplied from a load 30 such as the external charger or the like.

The battery control device 10 is electronic equipment that controls the battery 20. The battery control device 10 includes a main circuit 11, a bypass circuit 12, an instruction unit 13, an acquisition unit 14, and a diagnosis unit 15.

The main circuit 11 includes a first switch SW1 inserted between the battery 20 and the load 30. The first switch SW1 executes an opening/closing operation for closing a contact point (switch ON) or opening a contact point (switch OFF) based on an instruction from the instruction unit 13 to be described below. As the first switch SW1, for example, an excitation-type mechanical relay or a semiconductor relay can be used.

The bypass circuit 12 is inserted between the battery 20 and the load 30 and in parallel to the main circuit 11. The bypass circuit 12 includes a second switch SW2, a third switch SW3, a first diode D1, and a second diode D2. The second switch SW2, the first diode D1, and the third switch SW3 are connected in series in that order, and the second switch SW2 is connected on the battery 20 side and the third switch SW3 is connected on the load 30 side, respectively. The second diode D2 is connected in parallel to the first diode D1 with a rectification direction being opposite to that of the first diode D1. Hereinafter, the first diode D1 and the second diode D2, which are connected in parallel with their rectification directions being opposite to each other, will be referred to as a diode unit, as needed. The second switch SW2 and the third switch SW3 respectively and independently execute opening/closing operations for closing contact points (switch ON) or opening contact points (switch OFF) based on instructions from the instruction unit 13 to be described below. As the second switch SW2 and the third switch SW3, for example, P-channel type field-effect transistors (MOSFET: metal oxide semiconductor field-effect transistor) can be used. As the first diode D1 and the second diode D2, for example, PN-junction type diodes can be used.

The instruction unit 13 respectively and independently instructs the first switch SW1, the second switch SW2, and the third switch SW3 to open or close contact points. For example, an excitation-type mechanical relay can close (switch ON) a contact point by causing an excitation current to flow through a coil, and a field-effect transistor can close (switch ON) a contact point by applying an ON voltage to a gate.

The acquisition unit 14 appropriately acquires a voltage or a current detected at each part of the battery control device 10. The voltage or the current can be detected by, for example, various sensors (not shown) included in the battery control device 10 or other detection circuits, and acquired by the acquisition unit 14.

Specifically, as voltages at both ends of the second switch SW2, the acquisition unit 14 respectively acquires a "battery voltage $V_{LIB}$" that is a voltage at one end (a source in FIG. 1) of the second switch SW2, which is connected to the battery 20, and a "first diode voltage $V_{D1}$" that is a voltage at the other end (a drain in FIG. 1) of the second switch SW2, which is connected to the diode unit. Further, as voltages at both ends of the third switch SW3, the acquisition unit 14 respectively acquires a "load voltage $V_{AM}$" that is a voltage at one end (a source in FIG. 1) of the third switch SW3, which is connected to the load 30, and a "second diode voltage $V_{D2}$" that is a voltage at the other end (a drain in FIG. 1) of the third switch SW3, which is connected to the diode unit. In addition, the acquisition unit 14 acquires a "battery current $I_{LIB}$" that is a current flowing through the battery 20. The battery current $I_{LIB}$ is a signed current value where the direction in which the current flows into the battery 20 is represented by a positive value.

The diagnosis unit 15 diagnoses whether the first switch SW1 is operating normally based on the open/closed states of the contact points of the first switch SW1, the second switch SW2, and the third switch SW3, respectively, according to the instruction from the instruction unit 13, the battery voltage $V_{LIB}$, the load voltage $V_{AM}$, the first diode voltage $V_{D1}$, the second diode voltage $V_{D2}$, and the battery current $I_{LIB}$, which are acquired by the acquisition unit 14. Further, the diagnosis unit 15 diagnoses whether the second switch SW2 and the third switch SW3 are operating normally based on a voltage and an open/closed state of each switch. A diagnosis method will be described below.

The instruction unit 13, the acquisition unit 14, and the diagnosis unit 15 that are described above are typically composed of ECUs including processors, such as microcomputers, memories, and input/output interfaces, and each function can be realized when the processor reads and executes a program stored in the memory.

Control

Figure 2:
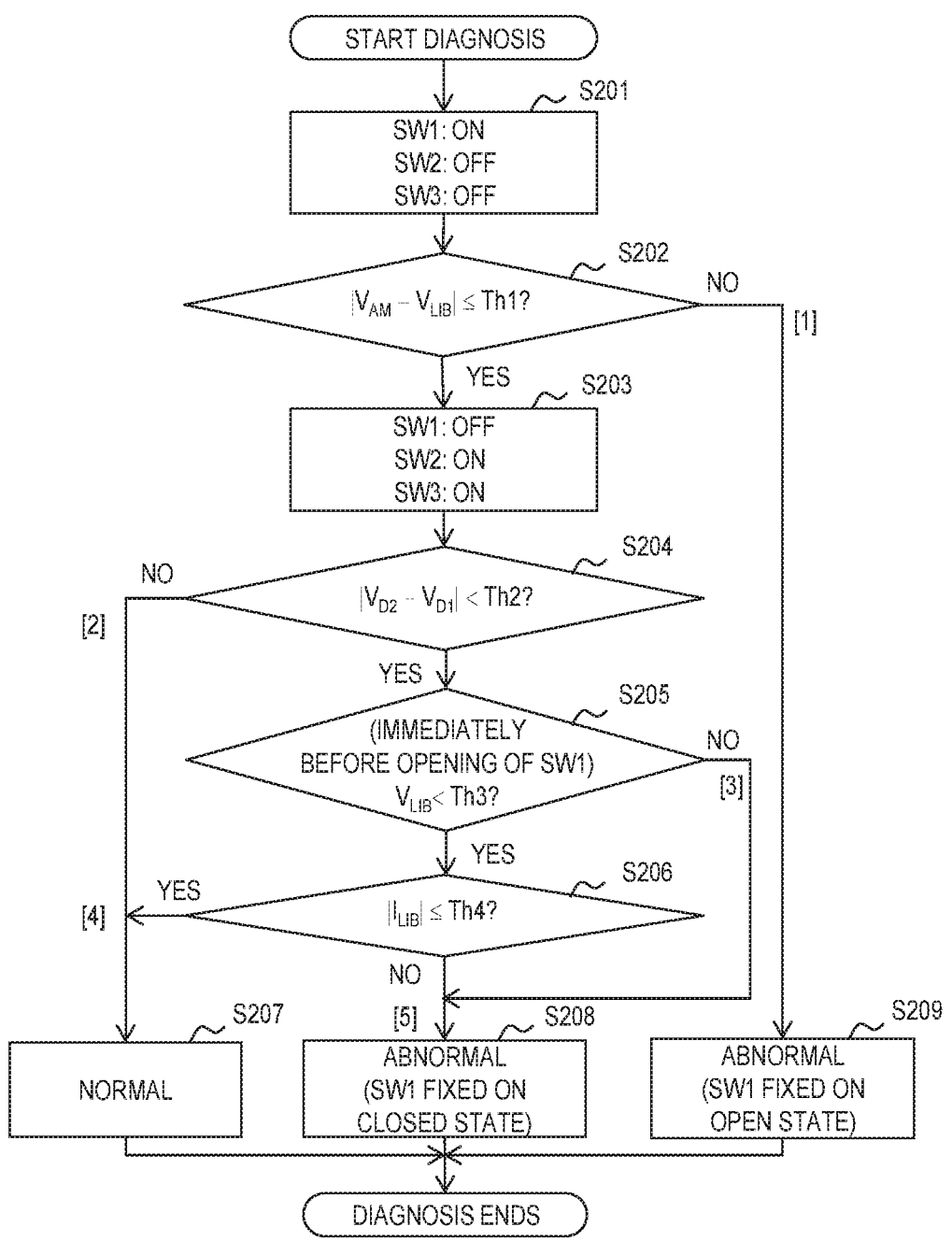
FIG. 2 is a flowchart of a process for controlling diagnosis of a main circuit, executed by the battery control device.
Figure 3:
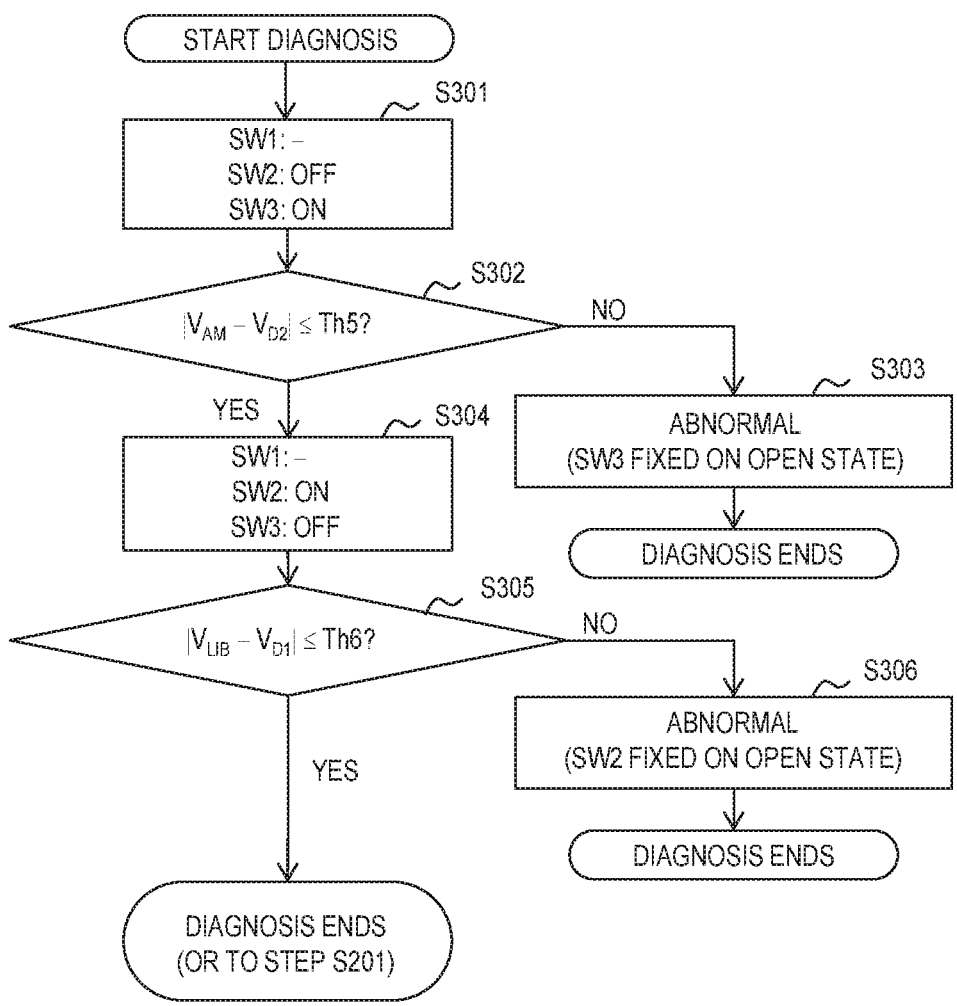
FIG. 3 is a flowchart of a process for controlling diagnosis of a bypass circuit, executed by the battery control device.

Next, control of a switch diagnosis executed by the battery control device 10 according to the present embodiment will be described with further reference to FIGS. 2 and 3. FIG. 2 is a flowchart illustrating a processing procedure of control of the main circuit diagnosis for diagnosing whether the first switch SW1 is operating normally. FIG. 3 is a flowchart illustrating a processing procedure of control of a bypass circuit diagnosis for diagnosing whether the second switch SW2 and the third switch SW3 are operating normally.

(1) Control of Main Circuit Diagnosis (FIG. 2)

The control of the main circuit diagnosis illustrated in FIG. 2 is a process for diagnosing the first switch SW1, and is executed during a period when ignition of the vehicle is off (IG-OFF).

Step S201: The instruction unit 13 of the battery control device 10 instructs the first switch SW1 to close (switch ON), and the second switch SW2 and the third switch SW3 to open (switch OFF). Such an open/closed state of each switch (SW1: ON, SW2: OFF, SW3: OFF) is referred to as a "first state". When the instruction unit 13 gives an open/close instruction to each switch such that the open/closed state of each switch becomes the first state, the process proceeds to step S202.

Step S202: The diagnosis unit 15 of the battery control device 10 determines whether an absolute value ($|V_{AM}-V_{LIB}|$) of a difference between the load voltage $V_{AM}$ and the battery voltage $V_{LIB}$ that are acquired by the acquisition unit 14 is equal to or lower than a first threshold Th1. This determination is made to determine whether the current is flowing through the first switch SW1. When the current is flowing through the first switch SW1, no voltage difference occurs between both ends of the first switch SW1. Therefore, the first threshold Th1 can be a voltage of "0V+error margin" that includes an error at the time of detecting the voltage.

When the absolute value of the difference between the load voltage $V_{AM}$ and the battery voltage $V_{LIB}$ is equal to or lower than the first threshold Th1 (Yes in S202), the diagnosis unit 15 determines that no voltage difference occurs between both ends of the first switch SW1 in response to the close instruction to the first switch SW1 (the first state). Then, the process proceeds to step S203. On the other hand, when the absolute value of the difference between the load voltage $V_{AM}$ and the battery voltage $V_{LIB}$ exceeds the first threshold Th1 (No in S202), the diagnosis unit 15 determines that a voltage difference, which is not expected to occur in a normal state, occurs between both ends of the first switch SW1 regardless of the close instruction to the first switch SW1 (the first state). Then, the process proceeds to step S209 (case [1]).

Step S203: The instruction unit 13 of the battery control device 10 instructs the first switch SW1 to open (switch OFF), and the second switch SW2 and the third switch SW3 to close (switch ON). Such an open/closed state of each switch (SW1: OFF, SW2: ON, SW3: ON) is referred to as a "second state". When the instruction unit 13 gives an open/close instruction to each switch such that the open/closed state of each switch becomes the second state, the process proceeds to step S204.

Step S204: The diagnosis unit 15 of the battery control device 10 determines whether an absolute value ($|V_{D2}-V_{D1}|$) of a difference between the first diode voltage $V_{D1}$ and the second diode voltage $V_{D2}$ that are acquired by the acquisition unit 14 is lower than a second threshold Th2. This determination is made to determine whether the current is flowing through the diode unit. Since a forward voltage Vf is generated in a diode through which the current flows, when the current flows through one of the first diode voltage $V_{D1}$ and the second diode voltage $V_{D2}$, a difference occurs between the first diode voltage $V_{D1}$ and the second diode voltage $V_{D2}$. Therefore, the second threshold Th2 can be the lower one of the forward voltage Vf of the first diode D1 and the forward voltage Vf of the second diode D2.

When the absolute value of the difference between the first diode voltage $V_{D1}$ and the second diode voltage $V_{D2}$ is lower than the second threshold Th2 (Yes in S204), the diagnosis unit 15 determines that the current, which is expected to flow in a normal state, does not flow in the bypass circuit 12 in response to the open instruction to the first switch SW1 (the second state). Then, the process proceeds to step S205. On the other hand, when the absolute value of the difference between the first diode voltage $V_{D1}$ and the second diode voltage $V_{D2}$ is equal to or higher than the second threshold Th2 (No in S204), the diagnosis unit 15 determines that the current, which is expected to flow in a normal state, is flowing in the bypass circuit 12 in response to the open instruction to the first switch SW1 (the second state). Then, the process proceeds to step S207 (case [2]).

Step S205: The diagnosis unit 15 of the battery control device 10 determines whether the battery voltage $V_{LIB}$ (or the load voltage $V_{AM}$), acquired by the acquisition unit 14 before the instruction unit 13 instructs the first switch SW1 to open (switch OFF) (immediately before the opening of SW1), is lower than a third threshold Th3. This determination is made to determine whether discharging from the battery 20 toward the load 30 is being executed. Therefore, the third threshold Th3 can be the maximum voltage specified for an external charger or the like on the assumption that, as the load 30, the external charger or the like is connected to the vehicle.

When the battery voltage $V_{LIB}$ immediately before the opening of SW1 is lower than the third threshold Th3 (Yes in S205), the diagnosis unit 15 determines that the discharging from the battery 20 toward the load 30 is not being executed in the second state. Then the process proceeds to step S206. On the other hand, when the battery voltage $V_{LIB}$ immediately before the opening of SW1 is equal to or higher than the third threshold Th3 (No in S205), the diagnosis unit 15 determines that the discharging from the battery 20 toward the load 30 is being executed in the second state, but that the current is not flowing through the bypass circuit 12 (because the determination in step S204 is "Yes"). Then, the process proceeds to step S208 (case [3]).

Step S206: The diagnosis unit 15 of the battery control device 10 determines whether an absolute value ($|I_{LIB}|$) of the battery current $I_{LIB}$ acquired by the acquisition unit 14 is equal to or lower than a fourth threshold Th4. This determination is made to determine whether charging from the load 30 toward the battery 20 is being executed while, as the load 30, an external charger or the like is connected, or whether the discharging (of a dark current) from the battery 20 toward the load 30 is being executed while, as the load 30, an external charger or the like is not connected. Therefore, the fourth threshold Th4 can be a predetermined value equal to or lower than the dark current.

When the absolute value of the battery current $I_{LIB}$ is equal to or lower than the fourth threshold Th4 (Yes in S206), the diagnosis unit 15 determines that a charging/discharging current, which is expected to flow in a normal state in the second state, is flowing between the battery 20 and the load 30. Then, the process proceeds to step S207 (case [4]). On the other hand, when the absolute value of the battery current $I_{LIB}$ exceeds the fourth threshold Th4 (No in S206), the diagnosis unit 15 determines that the charging/discharging current, which is not expected to flow in a normal state in the second state, is flowing between the battery 20 and the load 30. Then, the process proceeds to step S208 (case [5]).

Step S207: The diagnosis unit 15 of the battery control device 10 determines that the first switch SW1 is normal. When the diagnosis unit 15 has determined that the first switch SW1 is normal, the control of the main circuit diagnosis ends.

Step S208: The diagnosis unit 15 of the battery control device 10 determines that the first switch SW1 is abnormal. Specifically, the diagnosis unit 15 determines that the contact point of the first switch SW1 is fixed on the closed state (SW1 fixed on the closed state). When the diagnosis unit 15 has determined that the first switch SW1 is abnormal, the control of the main circuit diagnosis ends.

Step S209: The diagnosis unit 15 of the battery control device 10 determines that the first switch SW1 is abnormal. Specifically, the diagnosis unit 15 determines that the contact point of the first switch SW1 is fixed on the open state (SW1 fixed on the open state). When the diagnosis unit 15 has determined that the first switch SW1 is abnormal, the control of the main circuit diagnosis ends.

For each of the cases [1] to [5] described above, the voltage and the current at each part, whether an external charger or the like is connected, the charging/discharging state of the battery 20, the state of the first switch SW1, and the diagnosis result on the first switch SW1 are illustrated in FIG. 4.

(2) Control of Bypass Circuit Diagnosis (FIG. 3)

The control of the bypass circuit diagnosis illustrated in FIG. 3 can be arbitrarily executed before the control of the main circuit diagnosis illustrated in FIG. 2, as needed, for the purpose of further improving the accuracy of the diagnosis of the first switch SW1.

Step S301: The instruction unit 13 of the battery control device 10 instructs the second switch SW2 to open (switch OFF) and the third switch SW3 to close (switch ON). The first switch SW1 may be in one of the open state and the closed state. Such an open/closed state (SW1: —, SW2: OFF, SW3: ON) of each switch is referred to as a "third state". When the instruction unit 13 gives an open/close instruction to each switch such that the open/closed state of each switch becomes the third state, the process proceeds to step S302.

Step S302: The diagnosis unit 15 of the battery control device 10 determines whether an absolute value ($|V_{AM}-V_{D2}|$) of a difference between the load voltage $V_{AM}$ and the second diode voltage $V_{D2}$ that are acquired by the acquisition unit 14 is equal to or lower than a fifth threshold Th5. This determination is made to determine whether the third switch SW3 is conductive. Therefore, the fifth threshold Th5 can be a source-drain voltage of the third switch SW3 at the time of an ON operation.

When the absolute value of the difference between the load voltage $V_{AM}$ and the second diode voltage $V_{D2}$ is equal to or lower than the fifth threshold Th5 (Yes in S302), the diagnosis unit 15 determines that a current flows through the third switch SW3 in response to the close instruction to the third switch SW3 (the third state). Then, the process proceeds to step S304. On the other hand, when the absolute value of the difference between the load voltage $V_{AM}$ and the second diode voltage $V_{D2}$ exceeds the fifth threshold Th5 (No in S302), the diagnosis unit 15 determines that a current does not flow through the third switch SW3 despite the close instruction to the third switch SW3 (the third state). Then, the process proceeds to step S303.

Step S303: The diagnosis unit 15 of the battery control device 10 determines that the third switch SW3 is abnormal. Specifically, when, for example, the third switch SW3 is not turned on even when an ON voltage is applied to the gate, or the ON voltage is not applied to the gate of the third switch SW3, the diagnosis unit 15 determines that the contact point of the third switch SW3 is fixed on the open state (SW3 fixed on the open state). When it has been determined that the third switch SW3 is abnormal, the control of the bypass circuit diagnosis ends.

Step S304: The instruction unit 13 of the battery control device 10 instructs the second switch SW2 to close (switch ON) and the third switch SW3 to open (switch OFF). The first switch SW1 may be in one of the open state and the closed state. The open/closed state of each switch (SW1: —, SW2: ON, SW3: OFF) is referred to as a "fourth state". When the instruction unit 13 gives an open/close instruction to each switch such that the open/closed state of each switch becomes the fourth state, the process proceeds to step S305.

Step S305: The diagnosis unit 15 of the battery control device 10 determines that an absolute value ($|V_{LIB}-V_{D1}|$) of a difference between the battery voltage $V_{LIB}$ and the first diode voltage $V_{D1}$ that are acquired by the acquisition unit 14 is equal to or lower than a sixth threshold Th6. This determination is made to determine whether a current flows through the second switch SW2. Therefore, the sixth threshold Th6 can be a source-drain voltage of the second switch SW2 during an ON operation.

When the absolute value of the difference between the battery voltage $V_{LIB}$ and the first diode voltage $V_{D1}$ is equal to or lower than the sixth threshold Th6 (Yes in S305), the diagnosis unit 15 determines that a current flows through the switch SW2 in response to the close instruction to the second switch SW2 (the fourth state). Then, the control of the bypass circuit diagnosis ends. In this case, the process may subsequently proceed to step S201 of the control of the main circuit diagnosis. On the other hand, when the absolute value of the difference between the battery voltage $V_{LIB}$ and the first diode voltage $V_{D1}$ exceeds the sixth threshold Th6 (No in S305), the diagnosis unit 15 determines that a current does not flow through the second switch SW2 despite the close instruction to the second switch SW2 (the fourth state). Then, the process proceeds to step S306.

Step S306: The diagnosis unit 15 of the battery control device 10 determines that the second switch SW2 is abnormal. Specifically, when, for example, the second switch SW2 is not turned on even when an ON voltage is applied to the gate, or the ON voltage is not applied to the gate of the second switch SW2, the diagnosis unit 15 determines that the contact point of the second switch SW2 is fixed on the open state (SW2 fixed on the open state). When the diagnosis unit 15 has determined that the second switch SW2 is abnormal, the control of the bypass circuit diagnosis ends.

Action and Advantageous Effect

The battery control device 10 according to the embodiment of the present disclosure described above is provided, together with the first switch SW1 connecting the battery 20 and the load 30, with the bypass circuit 12 that can bidirectionally cause a current to flow (discharge/charge) between the battery 20 and the load 30. Therefore, the battery control device 10 diagnoses whether the first switch SW1 is operating normally based on the open/closed state of the first switch SW1 according to instructions, the voltage detected at each part of the bypass circuit 12, and the current flowing through the battery 20.

With the configuration of the bypass circuit 12, even when the contact point of the first switch SW1 is open for diagnosis of the first switch SW1, it is possible to supply a dark current from the battery 20 to the load 30 via the bypass circuit 12. Further, in the bypass circuit 12, bidirectionally causing a current to flow (charging/discharging) is realized by using two diodes connected in parallel with their rectification directions being opposite to each other. Therefore, even when an external charger or the like is connected to the battery 20 via the first switch SW1 for the charging of the battery 20, the voltage drop can be detected by the diode in the discharging direction or the charging direction. As such, the diagnosis of the first switch SW1 can be executed. As described above, the battery control device 10 can improve the accuracy of the diagnosis of the first switch SW1.

Although one embodiment of the present disclosure has been described above, the present disclosure can be understood as a battery control device, a battery control method executed by a battery control device including a processor and a memory, a control program that executes the battery control method, a computer-readable non-transitory storage medium storing the control program, and a vehicle equipped with a power supply system including the battery control device.

The battery control device according to the present disclosure can be used for a vehicle having a battery mounted thereon.

What is claimed is:

1. A battery control device that controls a connection between a battery and a load, the battery control device comprising:
   a first switch inserted between the battery and the load;
   a bypass circuit between the battery and the load, which is connected in parallel to the first switch, the bypass circuit including a second switch on the battery side, a diode unit composed of two diodes connected in parallel with rectification directions of the diodes being opposite to each other, and a third switch that are connected in series in that order; and
   a processor configured to:
      instruct the first switch, the second switch, and the third switch to open or close, respectively;
      acquire voltages of both ends of the second switch and voltages of both ends of the third switch, respectively; and
      diagnose whether the first switch operates normally based on instructed open or closed states of the switches and the acquired voltages.

2. The battery control device according to claim 1, wherein the processor is configured to, in a first state where the processor instructs the first switch to close and the second switch and the third switch to open, determine that an operation of the first switch is abnormal when an absolute value of a difference between a battery voltage that is a voltage at one end of the second switch to which the battery is connected and a load voltage that is a voltage at one end of the third switch to which the load is connected exceeds a first threshold.

3. The battery control device according to claim 2, wherein the processor is configured to, in a second state where the processor instructs the first switch to open and the second switch and the third switch to close, determine that the operation of the first switch is normal when a diode voltage, which is an absolute value of a difference between a voltage at the other end of the second switch to which the diode unit is connected and a voltage at the other end of the third switch to which the diode unit is connected is equal to or higher than a second threshold.

4. The battery control device according to claim 3, wherein the processor is configured to, in a third state where the processor instructs the second switch to open and the first switch and the third switch to close, determine that an operation of the third switch is abnormal when an absolute value of a difference between the load voltage and a voltage at the other end of the third switch to which the diode unit is connected exceeds a fifth threshold.

5. The battery control device according to claim 3, wherein the processor is configured to, in a fourth state where the processor instructs the third switch to open and the first switch and the second switch to close, determine that an operation of the second switch is abnormal when an absolute value of a difference between the battery voltage and a voltage at the other end of the second switch to which the diode unit is connected exceeds a sixth threshold.

6. The battery control device according to claim 3, wherein the processor is configured to, in the second state, determine that the operation of the first switch is abnormal when the diode voltage is lower than the second threshold and the battery voltage is equal to or higher than a third threshold immediately before opening the first switch.

7. The battery control device according to claim 6, wherein the processor is configured to:
further acquire a battery current, which is a current flowing through the battery; and
in the second state, determine that the operation of the first switch is abnormal when the diode voltage is lower than the second threshold, the battery voltage is lower than the third threshold, and the battery current exceeds a fourth threshold.

8. The battery control device according to claim 6, wherein the processor is configured to:
further acquire a battery current, which is a current flowing through the battery; and
in the second state, determine that the operation of the first switch is normal when the diode voltage is lower than the second threshold, the battery voltage is lower than the third threshold, and the battery current is equal to or lower than a fourth threshold.

9. A vehicle comprising:
the battery control device according to claim 1.

10. A control method executed by a computer of a battery control device, the battery control device controlling a connection between a battery and a load using a first switch inserted between the battery and the load, and a bypass circuit between the battery and the load, which is connected in parallel to the first switch, the bypass circuit including a second switch on the battery side, a diode unit composed of two diodes connected in parallel with rectification directions of the diodes being opposite to each other, and a third switch that are connected in series, in that order, the control method comprising:
instructing the first switch, the second switch, and the third switch to open or close, respectively;
acquiring voltages of both ends of the second switch and voltages of both ends of the third switch, respectively; and
diagnosing whether the first switch operates normally based on the instructed open or closed states of the switches and the acquired voltages.

11. A computer-readable storage medium storing a program that causes a computer of a battery control device to execute a function, the battery control device controlling a connection between a battery and a load using a first switch inserted between the battery and the load, and a bypass circuit between the battery and the load, which is connected in parallel to the first switch, the bypass circuit including a second switch on the battery side, a diode unit composed of two diodes connected in parallel with rectification directions of the diodes being opposite to each other, and a third switch that are connected in series, in that order, the function comprising:
instructing the first switch, the second switch, and the third switch to open or close, respectively;
acquiring voltages of both ends of the second switch and voltages of both ends of the third switch, respectively; and
diagnosing whether the first switch operates normally based on the instructed open or closed states of the switches and the acquired voltages.

\* \* \* \* \*